United States Patent
Bergeron

(10) Patent No.: US 9,614,614 B2
(45) Date of Patent: Apr. 4, 2017

(54) LOCATING A PHYSICAL CONNECTOR MODULE

(71) Applicant: Ixia, Calabasas, CA (US)

(72) Inventor: Matthew R. Bergeron, Thousand Oaks, CA (US)

(73) Assignee: IXIA, Calabasas, CA (US)

( * ) Notice: Subject to any disclaimer, the term of this patent is extended or adjusted under 35 U.S.C. 154(b) by 154 days.

(21) Appl. No.: 14/199,502

(22) Filed: Mar. 6, 2014

(65) Prior Publication Data

US 2015/0125144 A1    May 7, 2015

Related U.S. Application Data

(60) Provisional application No. 61/899,232, filed on Nov. 3, 2013.

(51) Int. Cl.
*G08G 1/00*       (2006.01)
*H04B 10/077*     (2013.01)
*H05K 7/14*       (2006.01)

(52) U.S. Cl.
CPC ....... *H04B 10/0773* (2013.01); *H05K 7/1498* (2013.01)

(58) Field of Classification Search
CPC .......................... H04B 10/0773; H05K 7/1498
USPC ...... 340/539.1, 539.11, 539.13, 568.1, 573.1
See application file for complete search history.

(56) References Cited

U.S. PATENT DOCUMENTS

| | | | | |
|---|---|---|---|---|
| 4,491,971 A | * | 1/1985 | Webb | G01S 1/68 340/539.1 |
| 5,251,907 A | * | 10/1993 | Ady | F42B 12/362 200/61.45 M |
| 5,929,777 A | * | 7/1999 | Reynolds | G01S 1/70 250/339.14 |
| 6,088,586 A | * | 7/2000 | Haverty | H04W 64/00 455/422.1 |
| 7,605,699 B2 | | 10/2009 | Tanaka | |
| 7,648,070 B2 | | 1/2010 | Droms et al. | |

(Continued)

FOREIGN PATENT DOCUMENTS

| EP | 2 778 627 A2 | 9/2014 |
|---|---|---|
| WO | WO 2013/020110 A2 | 2/2013 |
| WO | WO 2014/144948 A1 | 9/2014 |

OTHER PUBLICATIONS

Wessel, Rhea, "T-Systems, Intel Test RFID to Track Servers at Model Data Center," RFID Journal, pp. 1-2 (Feb. 2012).

(Continued)

*Primary Examiner* — Daryl Pope
(74) *Attorney, Agent, or Firm* — Jenkins, Wilson, Taylor & Hunt, P.A.

(57) ABSTRACT

Methods, systems, and computer readable media for locating a physical connector module are disclosed. According to one aspect, the subject matter described herein a method that includes selecting, via a locator beacon activation control function, a physical connector module to be located. The method further includes communicating, from the locator beacon activation control function, a locator beacon activation signal to a locator beacon activation client function included in the selected physical connector module and, in response to receiving the locator beacon activation signal at the locator beacon activation client function, triggering a transmission of a locator beacon from the selected physical connector module.

25 Claims, 3 Drawing Sheets

FIG. 1

(56) References Cited

U.S. PATENT DOCUMENTS

| | | |
|---|---|---|
| 7,848,905 B2 | 12/2010 | Troxler et al. |
| 8,395,506 B2 | 3/2013 | Elledge |
| 9,173,066 B1 | 10/2015 | Jain et al. |
| 2001/0034223 A1* | 10/2001 | Rieser .................... G01S 5/02 455/404.2 |
| 2003/0034887 A1* | 2/2003 | Crabtree ................. G01S 3/54 340/539.1 |
| 2006/0074513 A1 | 4/2006 | DeRose et al. |
| 2008/0129459 A1 | 6/2008 | Bailly et al. |
| 2010/0127828 A1 | 5/2010 | Connolly et al. |
| 2013/0215467 A1 | 8/2013 | Fein et al. |
| 2013/0308229 A1 | 11/2013 | Faxvog et al. |
| 2015/0125144 A1* | 5/2015 | Bergeron ............ H05K 7/1498 398/33 |
| 2016/0025784 A1 | 1/2016 | Ripp et al. |

OTHER PUBLICATIONS

Thibodeau, Patrick, "Finding lost IT with RFID," Computerworld, pp. 1-3 (Oct. 2010).

Commonly-assigned, co-pending U.S. Appl. No. 15/067,128 for "Methods Systems and Computer Readable Media for Management of Passive Network Taps Using Radio Frequency Identification (RFID)," (Unpublished, Mar. 10, 2016).

"Flat-Out, the Thinnest 8 Station GigaBit Fiber Tap HD8," Net Optics, Inc. https://www.netoptics.com/products/network-taps/gigabit-fiber-tap-hd8 (Feb. 25, 2012).

* cited by examiner

LOCATING A PHYSICAL CONNECTOR MODULE

PRIORITY CLAIM

This application claims the benefit of U.S. Provisional Patent Application Ser. No. 61/899,232, filed Nov. 3, 2013; the disclosure of which is incorporated herein by reference in its entirety.

TECHNICAL FIELD

The subject matter described herein relates to techniques and systems used for determining the location of computer devices and modules in data centers and laboratories. More particularly, the subject matter described herein relates to systems, methods, and computer readable media for locating a physical connector module.

BACKGROUND

Various technical facilities, such as data centers and research laboratories, are typically filled with production, storage, and testing equipment. In some cases, these facilities may be as large as a warehouse in order to accommodate the numerous data storage servers and testing computers. In such an environment of this size, finding a particular network component (e.g., a card, a port, a module, etc.) of small size from among the thousands of possibilities can be extremely burdensome and time consuming for a facility operator or administrator. Notably, such a task becomes of critical importance when the loss of the network component or module to be located would create considerable cost and expense.

Accordingly, there exists a need for methods, systems, and computer readable media for locating a physical connector module.

SUMMARY

Methods, systems, and computer readable media for locating a physical connector module are disclosed. According to one aspect, the subject matter described herein includes a method that comprises selecting, via a locator beacon activation control function, a physical connector module to be located. The method further includes communicating, from the locator beacon activation control function, a locator beacon activation signal to a locator beacon activation client function included in the selected physical connector module and, in response to receiving the locator beacon activation signal at the locator beacon activation client function, triggering a transmission of a locator beacon from the selected physical connector module.

The subject matter described herein may be implemented in hardware, software, firmware, or any combination thereof. As such, the terms "function", "node" or "module" as used herein refer to hardware, which may also include software and/or firmware components, for implementing the feature being described. In one exemplary implementation, the subject matter described herein may be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

The subject matter described herein will now be explained with reference to the accompanying drawings of which.

DETAILED DESCRIPTION

The subject matter described herein relates to methods, systems, and computer readable medium for locating a physical connector module. Reference will now be made in detail to exemplary embodiments of the presently disclosed subject matter, examples of which are illustrated in the accompanying drawings. Wherever possible, the same reference numbers will be used throughout the drawings to refer to the same or like parts. In one embodiment, the present subject matter enables a communications or data network test system administrator to readily locate a specific test port connector associated with a device under test (DUT). In addition to referring to a performance analysis or trial, the term "test" may further include any process or activity that is employed to provide a network visibility or monitoring function, such as monitoring live/real packet traffic that traverses a network. For example, the disclosed subject matter can be utilized within a network visibility architecture (e.g., physical and/or virtual system environments configured to monitor network security and application performance) and at network test setting alike. Various embodiments of the present subject matter are disclosed and described herein.

Figure 1:
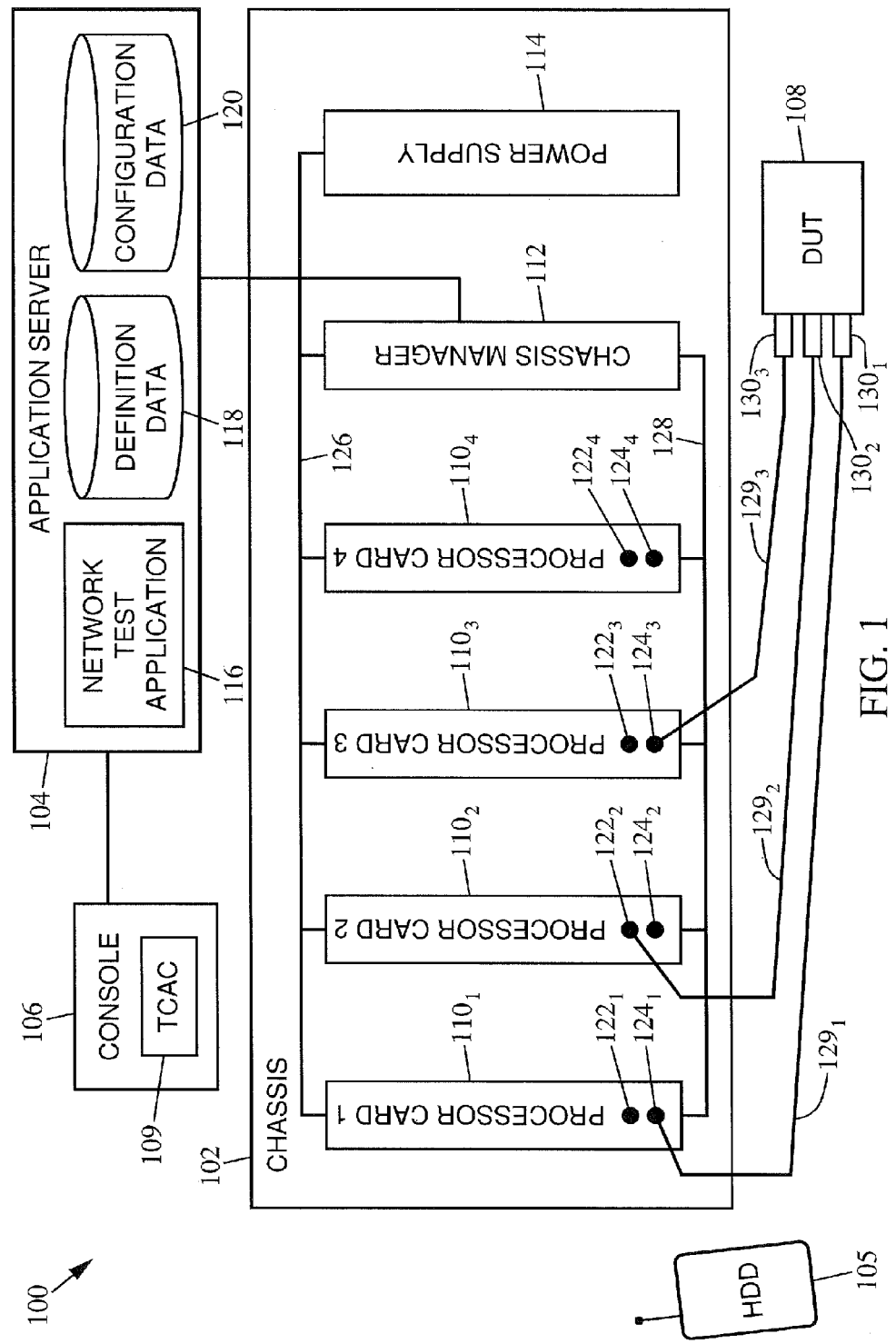
FIG. 1 is a block diagram illustrating an exemplary test simulation system according to an embodiment of the subject matter described herein.

FIG. 1 is a block diagram illustrating an exemplary test simulation system and/or equipment that may be located within a data center. While the exemplary embodiments disclosed and discussed herein illustrate deployments of the present subject matter in the context of network test tools and associated network test applications, the disclosed subject matter may also be employed in network monitoring tools and applications, such as live network monitoring environments. For example, FIG. 1 illustrates a system 100 that includes an exemplary network test system chassis 102 which may be connected to an application server 104 and a device under test (DUT) 108. Although only one DUT is depicted in FIG. 1, chassis 102 may be connected to additional DUTs without departing from the scope of the present subject matter. In some embodiments, chassis 102 includes a plurality of processor cards $110_{1...4}$, a chassis manager 112, and a power supply 114. In some embodiments, each of processor cards $110_{1...4}$, which are communicatively connected via an internal communication bus 126, includes a transmitting (Tx) test port 122 and a receiving (Rx) test port 124. Each transmitting test port 122 and receiving test port 124 on processor cards 110 may be coupled to DUT 108 via a physical cable connection 129. For example, FIG. 1 illustrates that processor card $110_1$ is connected to DUT 108 via physical cable connection $129_1$, processor card $110_2$ is connected to DUT 108 via physical cable connection $129_2$, and processor card $110_3$ is connected to DUT 108 via physical cable connection $129_3$.

In some embodiments, physical cable connection 129 may be a fiber optic cable and/or Ethernet cable attached to DUT 108 via a physical connector, such as physical connector 130. In some embodiment, physical connector 130 may include and/or be associated with an optics module (e.g., a test system optics module) that interfaces with DUT 108 (e.g., inserted into a port of the DUT). As used herein, an optics module includes a device that converts signals compatible for transmission via a copper line to signals compatible for transmission via a fiber optic line (and vice versa). In some embodiments, optical modules include the small interface devices that connect the fiber to the traditional copper network, data center, repeater module and most of the end points in optical networks. In some embodiments, the optical modules may be configured to maintain the integrity of the transmission. Exemplary optical modules include, but are not limited to, SFP transceiver modules, SFP+ transceiver modules, XFP modules, CXP modules, SFF modules, CFP modules, and the like. In some embodiments, physical connector 130 may incorporate hardware, firmware, and/or software that is used to interface with any number of optical physical interfaces. In some embodiments, each physical connector 130 may be associated with a respective locator module (not shown in FIG. 1).

In an alternate embodiment, physical connector 130 may include a plug or head unit that is configured to insert into or connect to a communication or data port of DUT 108 and to transmit and receive test packets. For example, physical connector 130 may be embodied as any of a plurality of different connector form factors, such as a Lucent connector (LC), a standard connector (SC), a multiple fiber push-on/pull-off (MTP), and the like. Similarly, physical connector 130 may be configured to accommodate any number of copper physical port interfaces on DUT 108 and may assume any number of connector form factors, such as RJ-45, USB "A", and the like.

In some embodiments, chassis manager 112 in chassis 102 may be connected to application server 104 as shown in FIG. 1. Chassis 102 may also be communicatively connected to a user console 106 via application server 104. User console 106 (e.g., a personal computer (PC), a smart phone, or any other computing device/terminal capable of executing applications via a hardware processor, etc.) may be configured to permit a network operator to provide chassis 102 with test simulation instructions and related data. Console 106 may also include a locator beacon activation control (LBAC) function or module 109 (e.g., a test connector activation control (TCAC) function) that is configured to send an activation signal to a physical connector module to be located upon receiving an identifier number associated with the physical connector module (e.g., a serial number or MAC address that identifies the physical connector module).

In some embodiments, application server 104 may include a hardware network element that is configured to store and provide data to chassis 102. Application server 104 may include a hardware processing unit (not shown) that is configured to run and execute a network test application 116. Network test application 116 may include software or firmware that is utilized to subject DUT 108 to a test session (e.g., packet traffic test simulation). Application server 104 may also be provisioned with a definition data storage unit 118 and a configuration data storage unit 120. In one embodiment, definition data storage unit 118 may include a database or memory configured to store definitions and protocols that may be utilized in a test simulation. Similarly, configuration data storage unit 120 may include a database or memory that is configured to store various configuration parameters that may be applied to DUT 108.

System 100 may also include a handheld detection device 105. In some embodiments, device 105 may include any mobile device that can be configured to wireless detect signals transmitted from physical connector 130 (see description of FIG. 2 below for details). For example, device 105 may be equipped with one or more directional antennas that enable device 105 to determine the directionality of received signals. Device 105 may be configured to provide an audible and/or visible alert to a user to indicate the proximity (e.g., near or far) to the transmitting physical connector 130. In an alternate embodiment, device 105 may be also be provisioned with a test connector activation control module to perform the functions of console 106.

Figure 2:
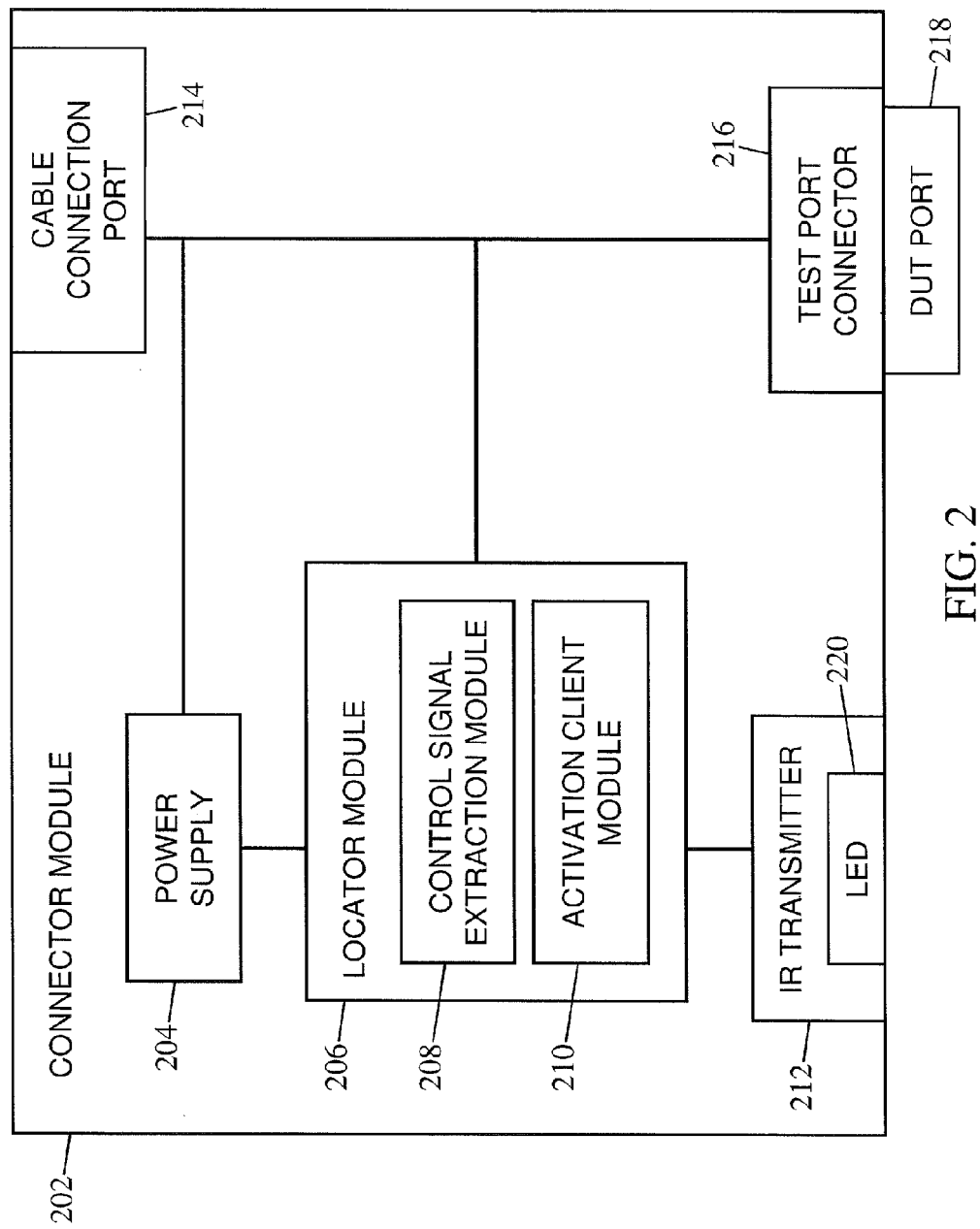
FIG. 2 is a block diagram illustrating an exemplary physical connector module according to an embodiment of the subject matter described herein.

FIG. 2 is a block diagram illustrating an exemplary physical connector module 202 according to an embodiment of the subject matter described herein. In some embodiments, physical connector module 202 in FIG. 2 represents the same device as physical connector module 130 depicted in FIG. 1. For example, physical connector module 202 may include a cable connection port 214 that is configured to receive a physical cable (e.g., physical connection cable 129 in FIG. 1) and a test port connector 216 (e.g., a plug or head unit) that is configured to insert into or couple into a receiving port 218 or jack of a DUT (e.g., DUT 108 in FIG. 1). Physical connector module 202 may also include a power supply module 204, a locator module 206, and an infrared transmitter 212. In one embodiment, power supply module 204 may be configured to receive power supplied by the test system via connector port 214 and to regulate power distribution throughout module 202. In another embodiment, power supply module 204 may include a battery source or may receive power from a DUT (e.g., via DUT port 218). In some embodiments, physical connector module 202 is associated with (e.g., included within) a network monitoring device located in a live network system and/or environment.

In some embodiments, locator module 206 includes a control signal extraction module 208 and a locator beacon activation client module 210. Notably, control signal extraction module 208 may be configured to receive a locator beacon activation signal from the test system (e.g., console 106 in FIG. 1) via cable connection port 214. In response to receiving the locator beacon activation signal, control signal extraction module 208 may direct locator beacon activation client module 210 to initiate the activation of a locator beacon signal.

In some embodiments, locator beacon activation client module 210 and/or physical connector module 202 may be configured to communicate with and be uniquely identifiable to a corresponding test connector activation control function that resides on or is associated with the test system (e.g., control function 109 in console 106 as shown in FIG. 1). For example, locator beacon activation client module 210 and/or physical connector module 202 may be identified using a unique device identifier, a network address, a media access control (MAC) address, a serial number, and the like. Control function 109 may be configured by a test system operator or administrator in a manner that triggers control function 109 to direct a signal or message toward a location activation client module (e.g., module 210) associated with a particular physical connector module (e.g., physical connector module 202) and/or a DUT port of interest (e.g., DUT port 218).

In response to receiving the signal via control signal extraction module 208, locator beacon activation client module 210 may be adapted to activate or power-up an IR transmitter 210. For example, locator beacon activation client module 210 may send a communication signal to IR transmitter 212 that triggers IR transmitter 212 to generate a transmission of a locator beacon from physical connector module 202. Infrared transmitter 212 may include any hardware circuit device or component configured to emit invisible light using an invisible light source, e.g., an infrared light emitting diode (LED) 220. In one embodiment, the transmission of the locator beacon may be emitted using infrared LED 220. The use of infrared light affords the present subject matter with numerous advantages. For example, an IR handheld detector is able to filter out of visible light and allow for easier and more accurate detection. The emission of IR light also allows for a better user experience since it reduces the number of visible blinking lights and allows for multiple people to simultaneously search and locate physical modules (e.g., if using a visible emitted light, only one physical connector module can be searched for and identified at a given time).

In one embodiment, IR transmitter 212 may be configured to emit a series of IR pulses or a pulse train in a manner that uniquely identifies physical connector module 202. In an alternate embodiment, IR transmitter 212 may be configured to emit a single, long-duration pulse (e.g., simply turn on and emit IR light continuously).

In some embodiments, the signal emitted from IR transmitter 212 may be detected by a passing handheld detection device or reader. For example, IR transmitter 212 may emit an IR signal that can be detected by a handheld detection device or reader as the handheld detection device is carried through a data center or laboratory facility. In one embodiment, the emitted IR light or pulse train is received and interpreted by handheld detector device. The handheld detection device may be configured to determine and/or reveal the direction-of-strongest-IR-signal-reception and indicate such directionality information to the handheld device operator via a display and/or an audible alert. In one embodiment, the handheld detection device may be configured to detect the relative power in each antenna to determine direction. Notably, the handheld detection device may be configured to read and interpret the locator beacon transmitted by the used to identify the physical connector module or the DUT test port.

In some embodiments, the present subject matter includes a physical connector that is similar to the infrared embodiment described above. However, in this embodiment, the locator module includes a visible spectrum LED or other light source instead of an IR light source. When activated by the activation control function of the test system, the visible spectrum LED transmitter is activated. In such an embodiment, the emitted visible light and/or pulse train may be detected by a human operator or technician without the use of a handheld detection device. In some embodiments, the emitted visible light and/or pulse train may be detected with a handheld device (e.g., in the event the visible light pulses are emitted in a manner that is too fast to be detected by the human eye). In some embodiments, the visible LED might be repurposed from another LED already present in the system (e.g., utilizing an existing LED device or module for another purpose). Because the pulses are not detectable by the human eye, the user experience is not degraded.

Figure 3:
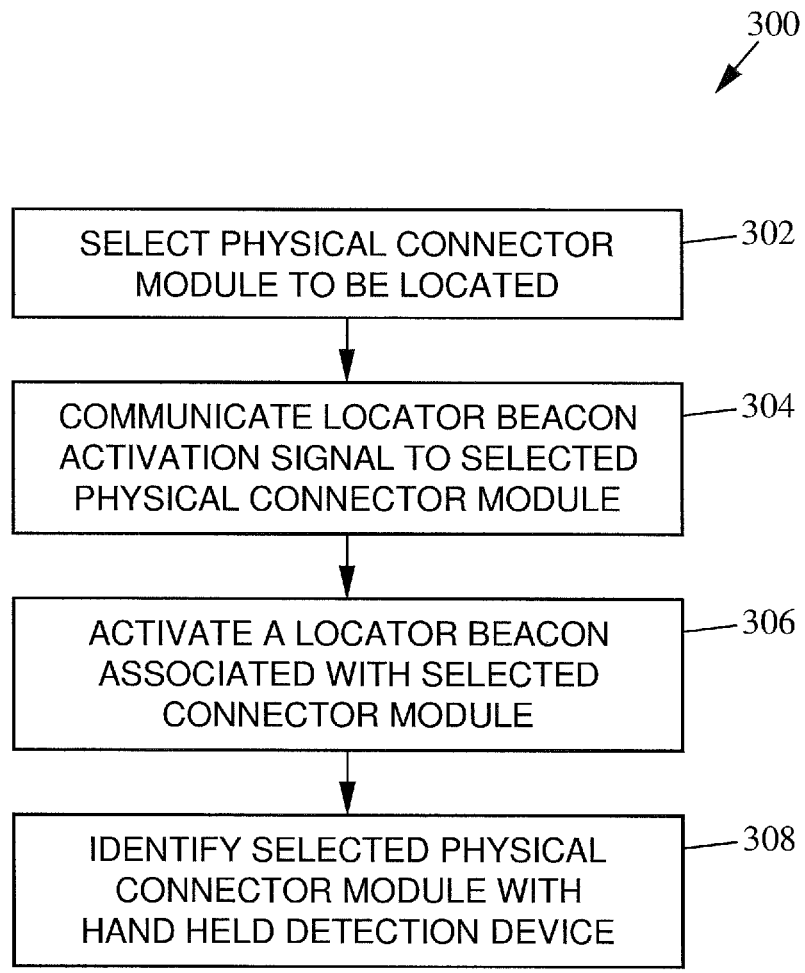
FIG. 3 is a flow chart illustrating an exemplary process for locating a physical connector module according to an embodiment of the subject matter described herein.

FIG. 3 is a flow chart illustrating an exemplary method 300 for locating a physical connector module according to an embodiment of the subject matter described herein. In step 302, a physical connector module to be located is selected. In one embodiment, a system operator may utilize a console or terminal to select a physical connector module that needs to be located in a data center. For example, the system operator may directly input an identifier number of the physical connect module into the console. Alternatively, the system operator may use a graphical user interface on the console to select a physical connector module which in turn triggers a test connector activation control function to access and/or query a database in order to obtain a unique identifier associated with the physical connector module to be located.

In step 304, a locator beacon activation signal is communicated to the selected physical connector module. In one embodiment, the test connector activation control function utilizes the unique identifier (e.g., obtained from operator's direct input or via database query) to communicate a locator beacon activation signal to the identified physical connector module.

In step 306, a locator beacon associated with selected physical connector module is triggered. In one embodiment, a locator beacon activation client function or module residing on the identified physical connector module is triggered to transmit a locator beacon.

In step 308, the selected physical connector module is identified using a handheld detection device. In one embodiment, a system operator or technician may utilize a handheld detection device to detect the IR locator beacon transmission. For example, while the operator is walking through the aisles of the data center, the handheld detection device may detect the transmitted locator beacon signal and alert the operator via an audible and/or visual alert.

What is claimed is:

1. A method for locating a physical connector module associated with a system, the method comprising:
    selecting, via a locator beacon activation control function, a physical connector module to be located;
    communicating, from the locator beacon activation control function, a locator beacon activation signal to a locator beacon activation client function included in the selected physical connector module; and
    in response to receiving the locator beacon activation signal at the locator beacon activation client function, triggering a transmission of a locator beacon from the selected physical connector module, wherein the transmission includes either a visible light transmission or an infrared (IR) transmission, wherein the physical connector module is associated with a device under test (DUT) located in a test system.

2. The method of claim 1 wherein the transmission of the locator beacon is wirelessly detected by a wireless handheld detection device.

3. The method of claim 2 wherein the wireless handheld detection device is configured to directionally determine a point of origin associated with the transmission of the locator beacon.

4. The method of claim 1 wherein the locator beacon activation control function is included in a user console.

5. The method of claim 1 wherein the physical connector module is associated with a network monitoring device located in a live network system.

6. The method of claim 1 wherein selecting the physical connector module further includes accessing a database to obtain a unique identifier associated with the selected physical connector module and utilizing the unique identifier to communicate the locator beacon activation signal to the selected physical connector module.

7. The method of claim 1 wherein the transmission of the locator beacon is generated by a transmitter integrated within the physical connector module.

8. The method of claim 1 wherein the transmission of the locator beacon includes a pulse train signal transmission or a single continuous pulse signal transmission.

9. The method of claim 1 wherein the locator beacon includes at least one of a MAC address or a serial number associated with the physical connector module.

10. The method of claim 1 wherein the physical connector module further includes a testing module.

11. A method for locating a physical connector module associated with a system, the method comprising:
    selecting, via a locator beacon activation control function, a physical connector module to be located;
    communicating, from the locator beacon activation control function, a locator beacon activation signal to a locator beacon activation client function included in the selected physical connector module; and
    in response to receiving the locator beacon activation signal at the locator beacon activation client function, triggering a transmission of a locator beacon from the selected physical connector module, wherein the transmission includes either a visible light transmission or an infrared (IR) transmission, wherein the physical connector module is either an optics module or a plug unit.

12. A method for locating a physical connector module associated with a system, the method comprising:
    selecting, via a locator beacon activation control function, a physical connector module to be located;
    communicating, from the locator beacon activation control function, a locator beacon activation signal to a locator beacon activation client function included in the selected physical connector module; and
    in response to receiving the locator beacon activation signal at the locator beacon activation client function, triggering a transmission of a locator beacon from the selected physical connector module, wherein the transmission includes either a visible light transmission or an infrared (IR) transmission, wherein the physical connector module is associated with a device under test (DUT) port or a DUT jack.

13. A system for locating a physical connector module, the system comprising:
    a physical connector module configured to receive a locator beacon activation signal and, in response to receiving the locator beacon activation signal at a locator beacon activation client function included in the physical connector module, to trigger a transmission of a locator beacon, wherein the transmission includes a visible light transmission or an infrared (IR) transmission, wherein the physical connector module is associated with a device under test (DUT) located in a test system; and
    a user console configured to utilize a locator beacon activation control function to select the physical connector module as a module to be located and to communicate the locator beacon activation signal to the physical connector module.

14. The system of claim 13 wherein the transmission of the locator beacon is wirelessly detected by a wireless handheld detection device.

15. The system of claim 14 wherein the wireless handheld detection device is configured to directionally determine a point of origin associated with the transmission of the locator beacon.

16. The system of claim 13 wherein the locator beacon activation control function is included in the user console.

17. The system of claim 13 wherein the physical connector module is associated with a network monitoring device located in a live network system.

18. The system of claim 13 wherein the user console is further configured to access a database to obtain a unique identifier associated with the selected physical connector module and utilizing the unique identifier to communicate the locator beacon activation signal to the selected physical connector module.

19. The system of claim 13 wherein the transmission of the locator beacon is generated by a transmitter integrated within the physical connector module.

20. The system of claim 13 wherein the transmission of the locator beacon includes a pulse train signal transmission or a single continuous pulse signal transmission.

21. The system of claim 13 wherein the locator beacon includes at least one of a MAC address or a serial number associated with the physical connector module.

22. The system of claim 13 wherein the physical connector module further includes a testing module.

23. A system for locating a physical connector module, the system comprising:
    a physical connector module configured to receive a locator beacon activation signal and, in response to receiving the locator beacon activation signal at a locator beacon activation client function included in the physical connector module, to trigger a transmission of a locator beacon, wherein the transmission includes a visible light transmission or an infrared (IR) transmission; and
    a user console configured to utilize a locator beacon activation control function to select the physical connector module as a module to be located and to communicate the locator beacon activation signal to the physical connector module, wherein the physical connector module is either an optics module or a plug unit.

24. A system for locating a physical connector module, the system comprising:
    a physical connector module configured to receive a locator beacon activation signal and, in response to receiving the locator beacon activation signal at a locator beacon activation client function included in the physical connector module, to trigger a transmission of a locator beacon, wherein the transmission includes a visible light transmission or an infrared (IR) transmission; and
    a user console configured to utilize a locator beacon activation control function to select the physical connector module as a module to be located and to communicate the locator beacon activation signal to the physical connector module, wherein the physical connector module is associated with a device under test (DUT) port or a DUT jack.

25. A non-transitory computer readable medium having stored thereon executable instructions that when executed by the processor of a computer control the computer to perform steps comprising:
    selecting, via a locator beacon activation control function, a physical connector module to be located;
    communicating, from the locator beacon activation control function, a locator beacon activation signal to a locator beacon activation client function included in the selected physical connector module; and in response to receiving the locator beacon activation signal at the locator beacon activation client function, triggering a transmission of a locator beacon from the selected physical connector module, wherein the transmission includes either a visible light transmission or an infrared (IR) transmission, wherein the physical connector module is associated with a device under test (DUT) located in a test system.

* * * * *